United States Patent [19]

Upton

[11] Patent Number: 5,270,667
[45] Date of Patent: Dec. 14, 1993

[54] IMPEDANCE MATCHING AND BIAS FEED NETWORK

[75] Inventor: David M. Upton, Mont Vernon, N.H.

[73] Assignee: Raytheon Company, Lexington, Mass.

[21] Appl. No.: 860,957

[22] Filed: Mar. 31, 1992

[51] Int. Cl.$^5$ ............................................. H03F 3/193
[52] U.S. Cl. ...................................... 330/277; 330/296; 330/306
[58] Field of Search .................. 330/277, 296, 306; 333/32, 103, 104

[56] References Cited

U.S. PATENT DOCUMENTS

| | | | |
|---|---|---|---|
| 3,129,386 | 4/1964 | Daly | 325/174 |
| 4,011,518 | 3/1977 | Irvine et al. | 330/277 X |
| 4,564,843 | 1/1986 | Cooper | 343/745 |
| 4,644,293 | 2/1987 | Kennett | 330/296 |
| 4,754,240 | 6/1988 | Marconi | 333/81 A |
| 4,806,944 | 2/1989 | Jacomb-Hood | 343/745 |

FOREIGN PATENT DOCUMENTS 216307  12/1984  Japan .................. 330/277

OTHER PUBLICATIONS

Pengelly, "Integrated Microwave Transistor Amplifiers" *Electronics & Power*, vol. 22, No. 7, pp. 449-453, Jul. 1976.

Wendl, "Fully Transistorized 10-w Transmitter Amplifier for TV Band III", *News from Rohde & Schwarz*, vol. 11, No. 50 (1971) pp. 26-28.

"Radio Engineers' Handbook," Frederick Emmons Terman, Sc.D., McGraw-Hill Book Company, Inc., 1943, pp. 208-215.

"Lightweight L-Band T/R Modules for SBR Applications," Government Microcircuit Applications Conference, Digest of Papers, Nov. 1991, P. Maloney, J. Sasonoff, Raytheon Company, Equipment Division, Wayland, MA pp. 191-241.

"Decreasing Cost of GaAs MMIC Modules is Opening up New Areas of Application," M. Borkowski, D. Laighton, Electronic Progress, vol. XXIX No. 2 1989, Corporate Office of Research and Development, Raytheon Company, pp. 32-41.

*Primary Examiner*—James B. Mullins
*Attorney, Agent, or Firm*—Walter F. Dawson; Richard M. Sharkansky

[57] ABSTRACT

An impedance matching and bias feed network for interfacing to a low noise amplifier of a receiver section of an electrically steered phased array antenna. The impedance matching and bias feed network includes an inductor and capacitor network for impedance transformation while providing in shunt with a 50 ohm input side of the network a gate bias path via the inductor to the low noise amplifier thereby substantially reducing the receiver noise figure.

10 Claims, 4 Drawing Sheets

IMPEDANCE MATCHING AND BIAS FEED NETWORK

Government has rights in this invention pursuant to Contract No. F30602-87-C-0187, awarded by the the Air Force.

BACKGROUND OF THE INVENTION

This invention relates to transmit/receive (T/R) apparatus of an electrically steered phased array antenna and in particular to an impedance matching and bias feed network for interfacing to a low noise amplifier.

Small size and light weight are key features of a T/R module comprising transmit, receive and digital controller circuits for airborne and space-based phased array antenna applications. An L-band T/R module measuring $1\Delta \times 2\Delta$ and weighing 16 grams is feasible today using gallium arsenide (GaAs) monolithic microwave integrated circuits (MMIC). Such a T/R module is described in a paper entitled, "Lightweight L-Band T/R Modules for SBR Applications," by Peter Maloney and John Sasonoff, Government Microcircuit Applications Conference, Nov. 1991, pp. 191-194. The receive portion of the T/R module comprising a T/R switch, an impedance matching and bias feed network, and a low noise amplifier (LNA) must provide very low noise figures (high sensitivity) minimal power consumption, and minimal distortion of an RF input signal. When GaAs MMIC technology is used in the transmit, receive, and digital controller portions of the T/R module, the design of the circuits of the receive portion such as the T/R switch and impedance matching and bias feed network often results in undesirable compromises due to the conflicting constraints of low noise (low-loss), the impedance transformations required, and high power handling capability in an OFF state.

The T/R switch is used to provide a matched termination load to the RF input source such as a circulator during a transmit mode of operation and to perform as an extremely low loss transparent switch during a receive mode of operation to preserve a minimum noise figure of the low noise amplifier. In the prior art a well known T/R switch comprises a $\pi$ network having ¼ wavelength lines (or L/C equivalents) in each leg of the $\pi$ along with field effect transistor (FET) switches. However, for space-based or airborne applications where small size and light weight are key requirements, the prior art techniques are not satisfactory.

An impedance matching and bias feed network coupled between the TR switch and the LNA performs the task of impedance transformation such as transforming a 50 ohm RF source input to a higher impedance such as the value of the input impedance of the low noise amplifier. Another function of such a network at the input to the low noise amplifier is to provide a bias voltage to an input circuit of the LNA without degrading the LNA performance characteristics. One type of matching network well known in the art comprises an L-C series network with a resistor shunted to a gate bias voltage. The impedance transformation takes place in the capacitor while the inductor serves to tune the reactive part of the FET input impedance. However, the drawbacks of this network include the size of the coil being relatively large and the gate bias resistor shunting an FET gate in the low noise amplifier which results in losses that raise the noise figure.

SUMMARY OF THE INVENTION

Accordingly, it is therefore an object of this invention to provide an improved impedance matching and bias feed network for a transmit/receive module element of an electrically steered phased array antenna.

It is a further object of this invention to provide an improved impedance matching and bias feed network at the input of a low noise amplifier in an RF receiver for improving the noise figure of the receiver.

The objects are further accomplished by providing an impedance matching and bias feed network comprising means for coupling an RF input signal to an input node of the network and for blocking a DC voltage, means coupled to the input node for transforming a source impedance of the RF input signal to a predetermined output impedance at an output node of the network, and an input bias voltage provided to the input node in shunt with the coupling and DC voltage blocking means for feeding the input bias voltage to the output node of the network. The impedance transforming means comprises an L type low pass resonant circuit. The impedance transforming means further comprises a shunt capacitor coupled to the input node of the impedance transforming means for tuning-out a reactive portion of the impedance transforming means and a series inductor having one end coupled to the input node and the other end coupled to the output node for tuning-out a real portion of the impedance transforming means. The input bias voltage comprises a high source impedance relative to the RF signal source impedance for producing a minimal loss of the RF input signal.

The objects are further accomplished by a combination of a low noise amplifier for amplifying an RF input signal, means coupled to the RF input signal for transforming a source impedance of the RF input signal to match an input impedance of the low noise amplifier, and an input bias voltage means coupled to the source impedance side of the impedance transforming means for feeding the input bias voltage to an input of the low noise amplifier. The impedance transforming means comprises an inductor means coupled to the input bias voltage means for feeding the input bias voltage to the input of the low noise amplifier. The impedance transforming means further comprises a capacitor means coupled between ground and the inductor means at the source impedance side of the transforming means for forming an L type low pass resonant circuit. The input bias voltage means comprises a high source impedance relative to the RF input signal source impedance for producing a minimal loss of the RF input signal.

The objects are further accomplished by a method for providing an impedance matching and bias feed network comprising the steps of coupling an RF input signal to an input node of the network while blocking a DC voltage to and from the input node with a capacitor means, transforming a source impedance of the RF input signal to a predetermined output impedance at an output node of the network, and providing an input bias voltage to the input node in shunt with the capacitor means for feeding the input bias voltage to the output node of the network. The step of transforming a source impedance to a predetermined output impedance comprises the use of an L type low pass resonant circuit. The step of transforming a source impedance to a predetermined output impedance comprises the steps of coupling the shunt capacitor means to the input node of the impedance transforming means for tuning-out a reactive portion of the impedance transforming means, and providing a series inductor having one end coupled to the input node and the other end coupled to the output node for tuning-out a real portion of the impedance transforming means. The step of providing the input bias voltage includes providing a high bias voltage source impedance relative to the RF signal source impedance for producing a minimal loss of the RF input signal.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
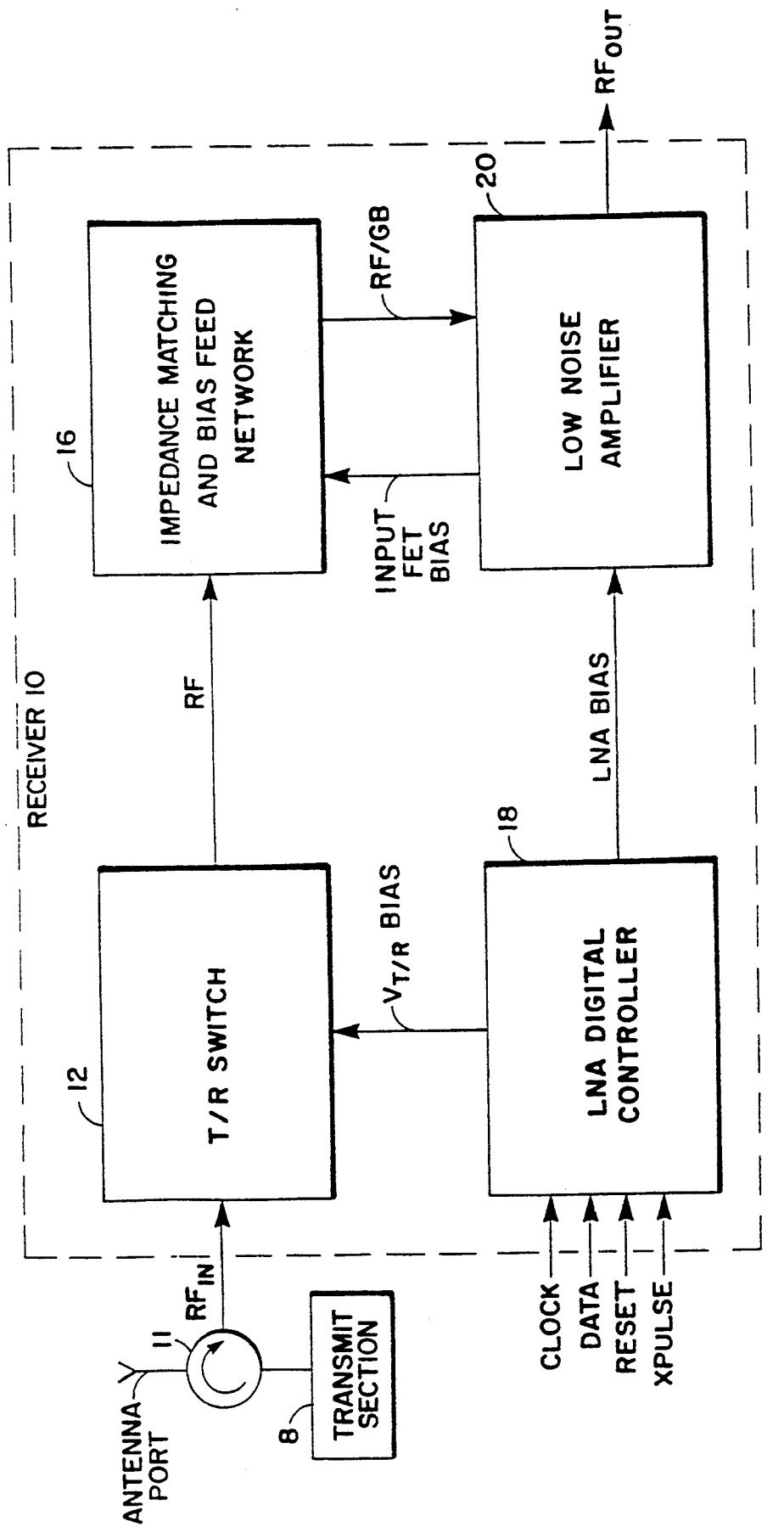
FIG. 1 shows a block diagram of a receiver portion of a T/R module comprising the inventions of a T/R switch and an impedance matching and bias feed network.

Referring to FIG. 1, a block diagram is shown of an L-band receiver 10 portion of a transmit/receive (T/R) module for an electrically steered phase array antenna comprising the invention. The receiver 10 comprises a T/R switch 12 which receives an $RF_{IN}$ signal from a circulator 11 and provides an RF signal to an impedance matching and bias feed network 16. In the transmit mode the T/R switch 12 provides a matched termination for the $RF_{IN}$ source impedance such as that of the circulator 11. The impedance matching and bias feed network 16 transforms a 50 ohm RF source impedance to approximately 300 ohms which is the input impedance of a low noise amplifier (LNA) 20 to which the RF signal is coupled; it also provides a bias feed for the LNA. An LNA digital controller 18 receives control signals from within the phased array antenna and generates a bias voltage signal ($V_{T/R}$ BIAS) for controlling the modes of the T/R switch 12 and an LNA BIAS voltage signal for the low noise amplifier 20. The low noise amplifier 20 generates an $RF_{OUT}$ signal.

Also shown in FIG. 1 is a transmit section 8 of a T/R module coupled to the circulator 11. The T/R switch 12 must provide the proper termination for the circulator 11 which is coupled to an antenna. The circulator 11 requires reasonably good matching (return loss greater than 15 dB) at all of its ports to achieve the required isolation. The T/R switch 12 circuit of the receiver 10 provides this termination function in the transmit mode to the circulator 11 when the receiver section is not active. The input port of the receiver 10 which receives $RF_{IN}$ "looks" like 50 ohms during transmit mode of operation. Also, the T/R switch 12 provides sufficient isolation for the receiver front-end so as to avoid damaging levels of power from going into the receiver 10. These two items conflict with each other when choosing input circuit topologies and components. Impedance transformation usually involves increases in signal voltage at the expense of signal current, thus increasing stress levels on components. Components that can safely dissipate high power levels are usually large and inefficient (lossy) at microwave frequencies. Receiver noise figure is directly degraded by any loss in the T/R switch 12, so it is desirable to minimize this as much as possible.

Figure 2:
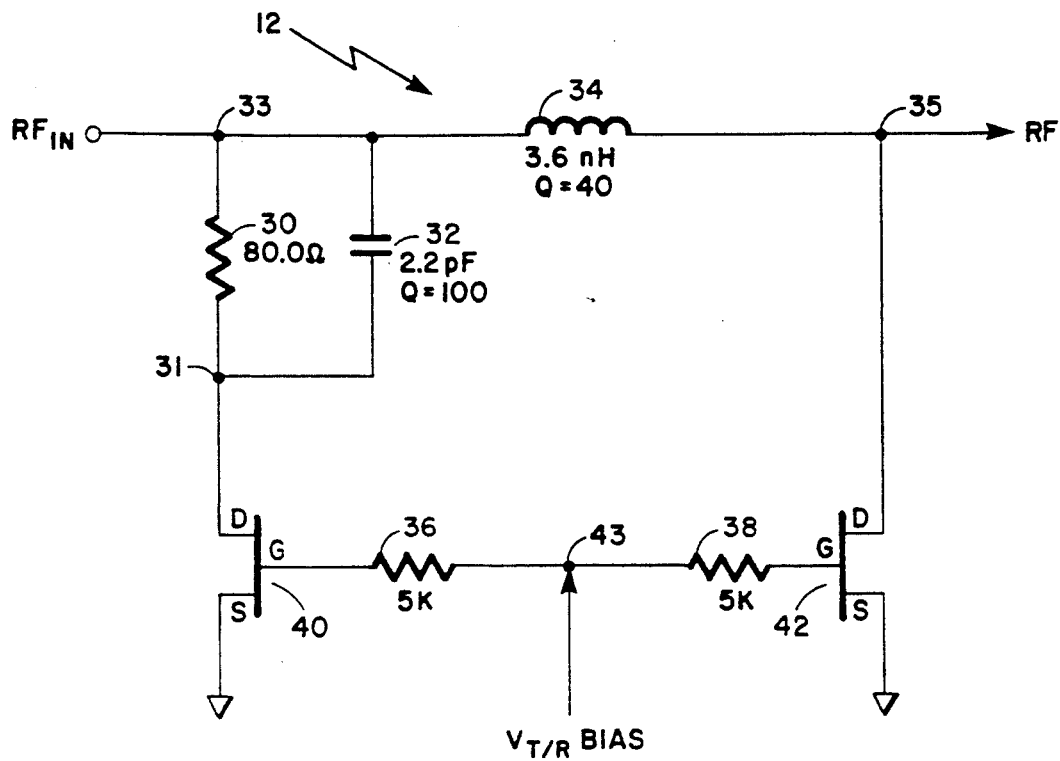
FIG. 2 is a schematic diagram of the T/R switch shown in FIG. 1.

Referring now to FIG. 2, the T/R switch 12 comprises a low-pass $\pi$ network for maintaining a 50 ohm termination to the RF source (circulator 11) during receive mode and to protect the low noise amplifier 20 during transmit mode. The T/R switch 12 generates approximately 45 degrees of phase delay between two field effect transistors (FET) 40 and 42. The $\pi$ network comprises an input branch having a low noise FET 40 coupled at a node 31 between one end of a resistor 30 in parallel with a bypass capacitor 32 and ground. An $RF_{IN}$ signal is fed to an input node 33 of the $\pi$ network and the other end of the resistor 30 and capacitor 32 parallel network. An output branch of the $\pi$ network comprises another low noise FET 42 coupled between an output node 35 of the $\pi$ network and ground; an inductor 34 is coupled between the input node 33 and the output node 35 of the network. A resistor 36 is connected to a gate input of FET 40, and likewise a resistor 38 is connected to a gate input of FET 42, the other ends of resistor 36 and resistor 38 being connected together at a node 43 that receives the control bias signal ($V_{T/R}$ BIAS) from the LNA digital controller 18.

The $\pi$ network of T/R switch 12 emulates a one-eighth wavelength transmission line over a narrow band centered at 1300 MHz ± 10%, but it exhibits the isolation and bandwidth characteristics of a one-quarter wavelength transmission line. It effectively isolates the FET 40 and 42 switches from a reflected transmit signal while using only approximately one-half the area on a substrate of a hybrid microwave integrated circuit (MIC) package typically required for a conventional quarter wavelength transmission line. Parasitic capacitances of FETs 40 and 42, primarily the drain to source capacitance ($C_{ds}$), are absorbed into the $\pi$ network. The drain to source resistance ($R_{ds}$) of FETs 40 and 42 is approximately 2 ohms when biased ON. When FETs 40 and 42 are pinched OFF, only the capacitances of the FETs affect circuit operation. When the FETs 40 and 42 are on ($V_{ds}=0.0V$), $R_{ds}$ swamps out most of the other circuit elements. The inductance of inductor 34 is determined by the specification in the present preferred embodiment that a 45 degree phase shift results from the $RF_{IN}$ signal passing through the $\pi$ network of the T/R switch 12. Other phase delay values in the range of 30 degrees to 60 degrees are feasible depending on the values of the other $\pi$ network elements. As the phase delay value decreases the performance of the T/R switch in the transmit mode degrades by the isolation decreasing. A 45 degree phase delay provides for reasonable isolation while minimizing component space on the substrate of a hybrid MIC package as well as reducing RF signal loss through the T/R switch 12 in the receive mode. The element values of the $\pi$ are determined by the following equations which are generally known to one skilled in the art and described in the "Radio Engineers Handbook" by F.E. Terman, McGraw-Hill Book Company, Inc., 1943, p. 212, where $Z_A$ and $Z_B$ are shunt elements of the $\pi$ network and $Z_c$ is the series element:

$$Z_A = j\frac{R1R2 \sin \beta}{R2 \cos \beta - \sqrt{R1R2}}$$

$$Z_B = j\frac{R1R2 \sin \beta}{R2 \cos \beta - \sqrt{R1R2}}$$

$$Z_C = j\sqrt{R1R2} \sin \beta$$

where:
R1 (source impedance) = R2 (load impedance) = 50 ohms
$\beta$ = insertion phase through $\pi$ network One skilled in the art recognizes that FET switches 40 and 42 are selected to be a certain size based on the power requirements and at the same time cannot be too large such that the network is not workable, i.e. it must be able to provide the 45 degree phase delay shift and 50 ohm impedance. Also, the inductor 34 parasitic capacitance and layout parasitic capacitance has to be considered when calculating the element values based on $Z_A$, $Z_B$ and $ZH_c$ in each portion of the $\pi$ network. The capacitor 32 in parallel with resistor 30 which is optimized at 80.0 ohms performs the function of returning the input reactive impedance to a 50 ohms resistive load to prevent reflection of the incoming transmitted signal when the T/R module is in the transmit mode. Without this capacitor 32, which is 2.2 pF, the loading of the $RF_{IN}$ by the FET 42 in the transmit mode would be excessive and isolation would be drastically reduced. When FET 42 is ON, a near-short would be seen at the node 33. However, capacitor 32 is provided to null-out the inductive reactance of inductor 34 so that no reflection occurs in the transmit mode.

Figure 4:
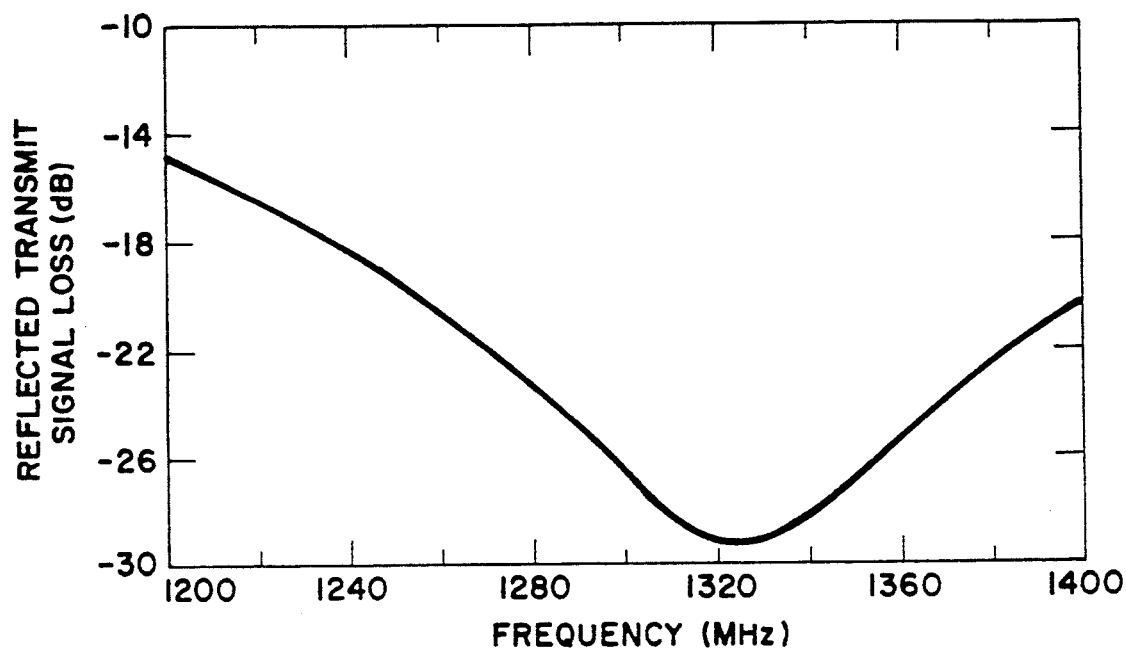
FIG. 4 is a graph of measured reflected transmit signal loss versus frequency of the receiver shown in FIG. 1 with the T/R switch operating in the transmit mode.

Still referring to FIG. 2, when the $V_{T/R}$ BIAS voltage signal is provided by the LNA digital controller 18, FETs 40 and 42 ar switched ON thereby putting the T/R switch in the transmit mode. In the transmit mode the T/R switch 12 provides the matched termination for the $RF_{IN}$ source impedance, thereby protecting the low noise amplifier 20 from the transmit signal. When FETs 40 and 42 are ON, the parallel network of resistor 30, capacitor 32 and inductor 34 results in a 50 ohm impedance. Although a small portion of the transmit signal may reflect off resistor 30 and pass through inductor 34, FET 42 shunts such reflection to ground. FIG. 4 shows a graph of measured reflected transmit signal loss versus operating frequency with the T/R switch 12 in the transmit mode. As shown, the T/R switch maintains at least −15 dB of reflected transmit signal loss over the 1200 MHz to 1400 MHz load with the minimum centered at 1320 MHz.

When the $V_{T/R}$ BIAS voltage signal is not active, the FETs 40 and 42 are OFF and the T/R switch 12 is in the receive mode. In the receive mode the function of the T/R switch 12 is to pass the $RF_{IN}$ signal to the input matching network 16 with minimal signal loss. In the receive mode, capacitor 32 has negligible effect because of the far greater pinch off capacitive reactance of FET 40 which is in series with capacitor 32. In the receive mode, the T/R switch 12 functions as a 50 ohm transmission line within the applicable frequency band with a phase delay of 45 degrees, and it does not alter the received input signal ($RF_{IN}$) other than by the phase delay. Thus, the net effect is to translate the plane of the input signal t the TR switch 12 to the input of the impedance matching and bias feed network 16. The pinch-off capacitances determined by the selection of the sizes of FETs 40 and 42 for power handling also contribute to the amount of phase delay in the receive mode.

The FETs, 40 and 42, may be embodied by a GaAs process comprising 1600 microns of total gate periphery organized as 8×200 micron wide fingers with each finger having a gate length of 0.9 microns. A single gate recess is used. The 0.4 micron thick doping profile has a nominal concentration of 1×10 to the 17th power per cubic centimeter atoms of dopant. The source to drain spacing is five microns with the source connections air-bridged over the gates and drains to minimize source inductance. Such FETs are manufactured by the Advanced Device Center, Raytheon Company of Andover, Mass. Resistor 30 may be embodied by an 80.0 ohm resistor Model No. TV0402GA manufactured by the TRX Division of Barry Industries of North Attleborough, Mass. Capacitor 32 may be embodied by a 2.2 pF capacitor Model No. ATC 111, manufactured by the American Technical Ceramics, Inc., of Huntington Station, N.Y. Inductor 34 may be embodied by a 3.6 nH (Q=40) spiral coil printed on a substrate manufactured by the Advanced Device Center, Raytheon Company of Andover, Mass. Resistor 36, 38 are thick film resistors printed on the substrate manufactured by the Advanced Device Center, Raytheon Company of Andover, Mass.

The overriding consideration in a low-noise amplifier design is the transformation of the input signal impedance to the value of $Z_{opt}$ determined for a particular input device of the low noise amplifier, where $Z_{opt}$ is defined as the source impedance presented to the device which minimizes additive noise contributions to the desired signal. In general, the additive noise due to the device can be absolutely minimized by varying both the apparent source impedance and the device bias conditions. This transformation is accomplished by means of a tuned L-C network. The loss through the circuit is dependent on the ratio of loaded Q ($Q_L$) to unloaded Q ($Q_U$) of the transformation network. Inductors will almost invariably present the lowest $Q_U$ in the network so they tend to limit the transformation range obtainable at acceptable insertion losses (IL). These considerations are summarized as follows:

$$IL(dB) = 20\log_{10}[1/(1-Q_L/Q_U)]$$

where:
$Q_U$ = Unloaded Q (Component Q)
$Q_L$ = Loaded $Q=(Z_L/Z_s)^{1/8}+1$ (Transformation Q of circuit).
$Q_L = of/(BW_{-3dB})$
$Z_L$ = Load Impedance
$Z_s$ = Source Impedance Thus, the required impedance transformation should be kept to as small a ratio as possible to avoid large losses with minimal Q components. Inductors fabricated by thin-film techniques on thin alumina ($Al_2O_3$) substrates have a much higher unloaded Q compared to conventional spiral inductors fabricated on 100 $\mu$m GaAs. The "noise tuning" of an FET is improved by allowing larger transformations with very little loss.

Figure 3:
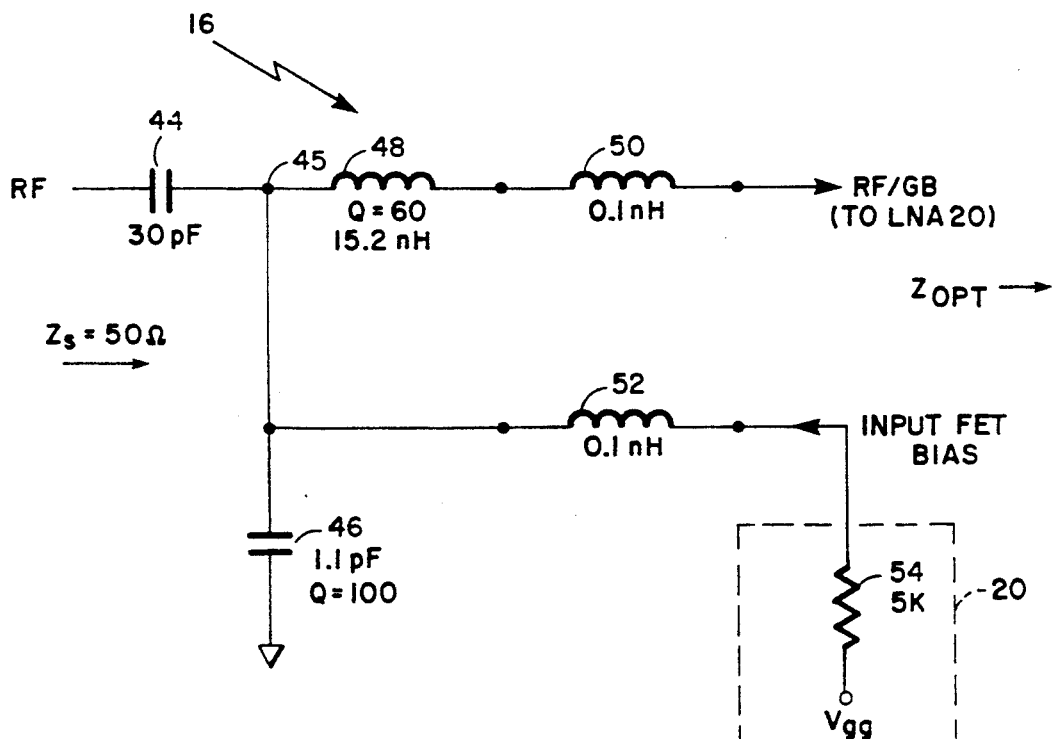
FIG. 3 is a schematic diagram of the impedance matching and bias feed network shown in FIG. 1.

Referring now to FIG. 3, the impedance matching and bias feed network 16 is shown which is a two-pole, low-pass network used to perform an impedance transformation function from a 50 ohm input to 300 ohms output ($Z_{OPT}$) with a minimum number of components. It comprises a 30 pF DC bias blocking capacitor 44 connected to a node 45 which has coupled to it a 1.1 pF capacitor 46 for resonating an inductor 48, the other end of capacitor 46 being connected to ground. Also connected to such node 45 is the 15.2 nH inductor 48. Inductor 48 is connected in series with a 0.1 nH equivalent inductor 50 which results from a bond wire inductance. Another 0.1 nH equivalent inductor 52 is connected to such node 45 which also results from a bond wire inductance and the other end of equivalent inductor 52 is in series with a 5K resistor 54 (usually located in LNA 20) which is connected to a $V_{gg}$ gate bias. An Input FET Bias voltage signal from LNA 20 is fed to node 45 via the bond wire having an equivalent inductance of 0.1 nH; such input FET Bias voltage passes through inductor 48 and inductor 50 and becomes the RF/GB voltage signal which is fed to an input FET gate in the LNA 20. Bringing the Input FET Bias voltage signal into node 45 puts the bias line in shunt with the 50 ohm side of the impedance matching and bias feed network 16 and not the high impedance side as done in the prior art, thereby providing the means for a significant improvement in the noise figure of the receiver 10.

Hence, the impedance matching and bias feed network 16 provides the means of transforming the 50 ohms input impedance to the 300 ohms $Z_{OPT}$ impedance required by the FET in LNA 20 for minimum noise, and at the same time provides an FET gate bias to the LNA 20 in a way that significantly improves the receiver 10 noise figure. The impedance matching and bias feed network 16 is basically an L-network with a low pass response. The loaded Q of the network is set such that the resulting impedance transformation equals $Z_{OPT}$. Since an L-network has the minimum number of poles for a resonant transforming network, it provides the broadest possible bandwidth. The capacitor 46 is provided to tune the reactive portion of the transformation and the inductors 48 and 50 tune the real portion.

Figure 5:
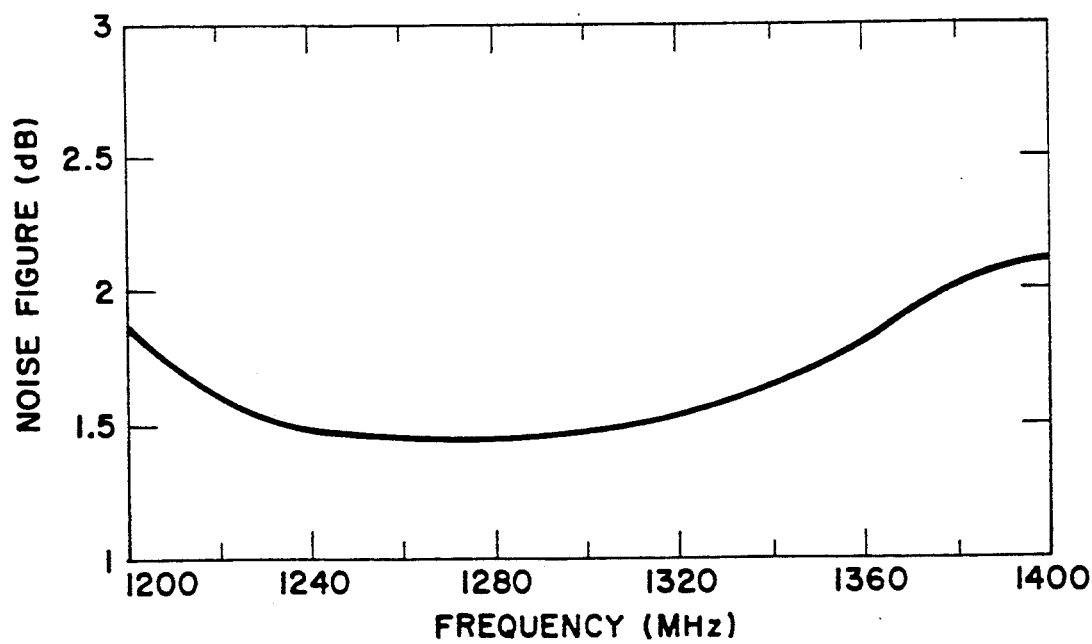
FIG. 5 is a graph of measured noise figure versus frequency of the receiver shown in FIG. 1.

Referring now to FIG. 3 and FIG. 5, the two pole impedance matching and bias feed network 16 as shown in FIG. 3 provides the widest possible bandwidth with the fewest components as previously noted if the element values and Q's are controlled. Eliminating unnecessary inductors helps to achieve low noise performance. The blocking capacitor 44, which is 30 pF, has so small a reactance that it has little effect on the tuning in the network, and therefore it is ignored. The Input FET Bias voltage is fed from the LNA 20 in shunt with this blocking capacitor 44 through series inductors 48 and 50 and then to an FET gate input (not shown) in the LNA 20. This technique of providing such gate bias at the 50 ohm input impedance of the impedance matching and bias feed network 16 as seen at the node 45 substantially reduces the RF signal losses at the input to an FET gate circuit in LNA 20. The 300 ohm $Z_{OPT}$ source impedance seen by an FET in the LNA 20 results in a minimum noise figure for the LNA 20 and therefore the receiver 10. FIG. 5 shows a graph of the measured noise figure versus frequency of the receiver 10 shown in FIG. 1. As shown, the noise figure varies from 1.8 dB to 2.1 dB over the frequency range of 1200 MHz to 1400 MHz.

Capacitor 44 may be embodied by a 30 pF capacitor, Model No. ATC 100 manufactured by American Technical Ceramics, Inc. of Huntington Station, N.Y. Capacitor 46 may be embodied by a 1.1 pF capacitor, Model No. ATC 111 manufactured by American Technical Ceramics, Inc. of Huntington Station, N.Y. Inductor 48 may be embodied by a 15.2 nH inductor (Q=60) printed on a substrate manufactured by the Advanced Device Center, Raytheon Company of Andover, Mass. Inductors 50 and 52 are each 0.1 nH and are embodied by 0.7 mil interconnection gold bond wires.

Referring again to FIG. 1, the low noise amplifier 20 comprises a two-stage GaAs MMIC chip, embodied by Model RMML 2010 manufactured by the Advanced Device Center, Raytheon Company of Andover, Mass. The LNA 20 MMIC comprises two FETs similar to FETs 40 and 42 in the T/R switch 12, but with an additional implant of dopant known as N-plus. The additional dopant is used to reduce contact resistance and thereby losses at the metal interfaces of the device. A single gate recess is used. Otherwise, these FETs are very similar to the switch FETs 40, 42 as far as processing is concerned. Both LNA FETs are 400 microns in overall gate periphery organized as 4×100 microns in gate width. The gate length for these FETs is also 0.9 microns. The LNA 20 has an approximate conjugate match employed between the input stage and output stage while a slight amount of series feedback from source inductors assures stability. Both interstage and output matching networks are multi-pole high-pass types for enhanced bandwidth and stability. The frequency response of the amplifier is broadband from 1.2 to 1.6 GHz while exhibiting a gain of about 17 dB with no matching at the input. Under such conditions, the amplifier presents a noise figure of about 4 dB. It is unconditionally stable for all input and output terminations. Normal operating voltages are 6.0 Vdc for the drain supply and −2.3 Vdc for the gate bias supply. The T/R switch 12 requires an additional −5 to −7 Vdc to place the switch FETs (40 and 42) in a "pinched-off" state and allow the receiver to function. Normal power consumption is 20 to 30 mA or less than 200 mW.

The LNA Digital controller 18 comprises an eight-bit shift register, data latches and control timing. It is implemented with a GaAs chip using buffered FET Logic. Data input to the chip is at levels of 0 or −5 volts and the outputs from the data latches are at similar levels. In order to conserve power, unused parts of the chip can be disabled by selective bonding of the power to the chip. A 32-bit control word is provided on a data line which specifies phase-shift, attenuator setting, T/R state and transmit mode. In addition to the data line, a clock (shift) signal, reset, and XPULSE signals are provided to the controller 18. The reset signal sets the T/R module to an OFF state. XPULSE determines the duty cycle of the T/R module. Such a digital controller 18 is further described in the previously referenced paper by P. Maloney and J. Sasonoff.

Figure 6:
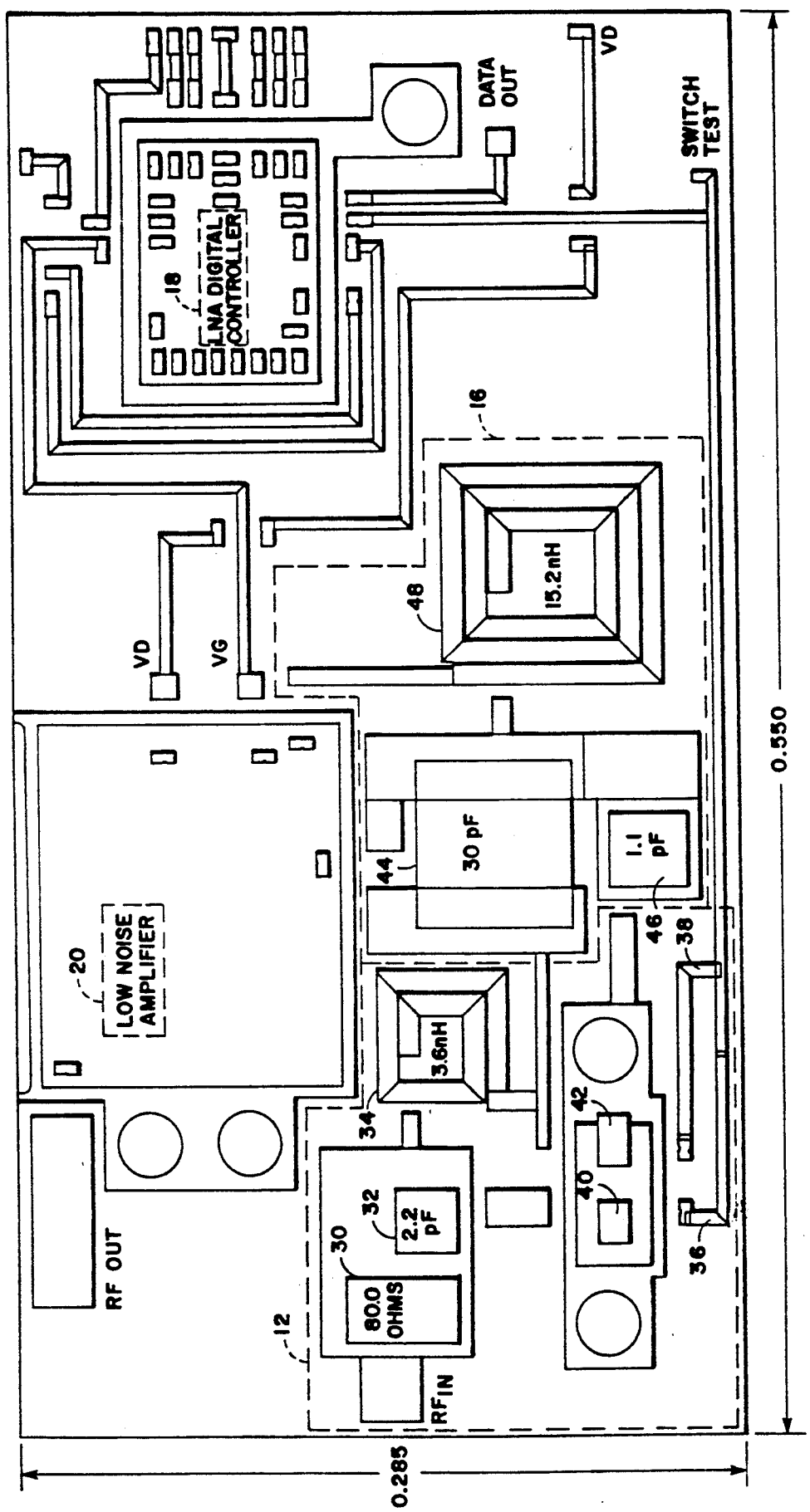
FIG. 6 shows an alumina substrate layout of the receiver portion of a T/R module shown in FIG. 1.

Referring now to FIG. 6, an alumina substrate layout is shown of the receiver 10 portion of a T/R module as shown in FIG. 1. The dimensions indicated at the perimeter of the substrate are in inches. Interconnections (not shown) are made with 0.7 mil diameter gold bond wire. The alumina substrate is 25 mil thick and rated at 99% pure (ALO) for tight control of the dielectric constant. The T/R switch 12 and the impedance matching and bias feed network 16 are located in the bottom left area of the substrate and each comprises only approximately one-sixth of the total substrate area which is a significant improvement over prior art implementation. Such alumina substrate may be embodied by Part No. 13192 manufactured by the Advanced Device Center, Raytheon Company of Andover, Mass.

The prospect of saving a few tenths of a dB in noise figure might not seem worthwhile unless one takes into account the economies of scale involved in fielding a large phased array. For example, when working with low noise figures, a tenth of a dB in reduced noise figure can allow the reduction in system transmitter power by 1 dB. The embodiments described herein allow for the noise figure of an L-band LNA to be reduced by up to 0.75 dB from the prior art embodiments. A few tenths of a dB of economy in transmitter power can lead to significant cost-saving reductions in drive power requirements, DC power supplied, and module cooling systems used. Similarly, smaller amounts of real estate used in the module circuits allow for tighter packaging to comply with application requirements for decreasing physical size and higher frequency operation.

This concludes the description of the preferred embodiment. However, many modifications and alterations will be obvious to one of ordinary skill in the art without departing from the spirit and scope of the inventive concept. For example, the capacitor and inductor values of the preferred embodiment are determined based on the operating frequency desired. Therefore, it is intended that the scope of this invention be limited only by the appended claims.

What is claimed is:

1. An impedance matching and bias feed network for a low noise amplifier comprising:
   means for coupling an RF input signal to an input node of said network and for blocking a DC voltage;
   means coupled to said input node for transforming a source impedance of said RF input signal to a predetermined output impedance at an output node of said network, said impedance transforming means comprises an L type low pass resonant circuit; and
   an input bias voltage provided to said input node in shunt with said coupling and DC voltage blocking means for feeding said input bias voltage to said output node of said network.

2. The impediance matching and bias feed network as recited in claim 1 wherein:
   said impedance transforming means comprises a shunt capacitor coupled to said input node of said impedance transforming means for tuning-out a reactive portion of said impedance transforming means and a series inductor having one end coupled to said input node and the other end coupled to said output node for tuning-out a real portion of said impedance transforming means.

3. The impedance matching and bias feed network as recited in claim 1 wherein:
   said input bias voltage comprises a high source impedance relative to said RF signal source impedance for producing a minimal loss of said RF input signal.

4. In combination:
   a low noise amplifier for amplifying an RF input signal;
   means coupled to said RF input signal for transforming a source impedance of said RF input signal to match an input impedance of said low noise amplifier, said transforming means comprises an L type low pass resonant circuit; and
   an input bias voltage means coupled to a source impedance side of said impedance transforming means for feeding said input bias voltage to an input of said low noise amplifier.

5. The combination as recited in claim 4 wherein:
   said impedance transforming means comprises an inductor means coupled to said input bias voltage means for feeding said input bias voltage to said input of said low noise amplifier.

6. The combination as recited in claim 5 wherein:
   said impedance transforming means further comprises a capacitor means coupled between ground and said inductor means at said source impedance side of said transforming means for forming said L type low pass resonant circuit.

7. The combination as recited in claim 4 wherein:
   said input bias voltage means comprises a high source impedance relative to said RF input signal source impedance for producing a minimal loss of said RF input signal.

8. A method for providing an impedance matching and bias feed network at the input of a low noise amplifier comprising the steps of:
   coupling an RF input signal to an input node of said network while blocking a DC voltage to and from said input mode with a capacitor means;
   transforming a source impedance of said RF input signal to a predetermined output impediance at an output node of said network using an L type low pass resonant circuit; and
   providing an input bias voltage to said input node in shunt with said capacitor means for feeding said input bias voltage to said output node of said network.

9. The method as recited in claim 8 wherein said step of transforming a source impedance to a predetermined output impedance comprises the steps of:
   coupling a shunt capacitor means to said input node of said impedance transforming means for tuning-out a reactive portion of said impedance transforming means; and
   providing a series inductor having one end coupled to said input node and the other end coupled to said output node for tuning-out a real portion of said impedance transforming means.

10. The method as recited in claim 8 wherein said step of providing said input bias voltage includes providing a high bias voltage source impedance relative to said RF signal source impedance for producing a minimal loss of said RF input signal.

* * * * *